(12) United States Patent
Shin et al.

(10) Patent No.: US 11,327,681 B2
(45) Date of Patent: May 10, 2022

(54) MEMORY SYSTEM WITH A ZONED NAMESPACE AND AN OPERATING METHOD THEREOF

(71) Applicant: SK hynix Inc., Gyeonggi-do (KR)

(72) Inventors: Hee Chan Shin, Gyeonggi-do (KR); Young Ho Ahn, Gyeonggi-do (KR); Yong Seok Oh, Gyeonggi-do (KR); Jhu Yeong Jhin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 97 days.

(21) Appl. No.: 16/943,701

(22) Filed: Jul. 30, 2020

(65) Prior Publication Data
US 2021/0263674 A1 Aug. 26, 2021

(30) Foreign Application Priority Data

Feb. 25, 2020 (KR) .................. 10-2020-0022920

(51) Int. Cl.
*G06F 3/06* (2006.01)
*G11C 16/26* (2006.01)
*G11C 16/10* (2006.01)

(52) U.S. Cl.
CPC .......... *G06F 3/0656* (2013.01); *G06F 3/0614* (2013.01); *G06F 3/0631* (2013.01); *G06F 3/0659* (2013.01); *G06F 3/0679* (2013.01); *G11C 16/10* (2013.01); *G11C 16/26* (2013.01)

(58) Field of Classification Search
CPC ...................................... G06F 3/06
USPC ...................................... 711/154
See application file for complete search history.

(56) References Cited

U.S. PATENT DOCUMENTS

| 11,030,099 | B2* | 6/2021 | Ji ..................... | G11C 16/30 |
| 11,137,920 | B1* | 10/2021 | Bert ..................... | G06F 3/061 |
| 2020/0167274 | A1* | 5/2020 | Bahirat ..................... | G06F 3/064 |
| 2021/0182166 | A1* | 6/2021 | Hahn ..................... | G06F 3/0688 |
| 2021/0223962 | A1* | 7/2021 | Esaka ..................... | G06F 3/061 |

(Continued)

FOREIGN PATENT DOCUMENTS

| KR | 10-1831226 | 2/2018 |
| KR | 10-2019-0105414 | 9/2019 |

OTHER PUBLICATIONS

USENIX, Vault'20 Conference Program (Feb. 24, 2020). (Year: 2020).*

(Continued)

*Primary Examiner* — Michael Krofcheck
*Assistant Examiner* — John Francis Wojton
(74) *Attorney, Agent, or Firm* — IP & T Group LLP

(57) ABSTRACT

A memory system with at least one namespace includes a memory device and a controller. The memory device includes a plurality of single-level cell (SLC) buffers and a plurality of memory blocks, wherein each memory block includes a plurality of memory cells, each memory cell storing multi-bit data, and is allocated for a respective one of a plurality of zones, wherein each of the at least one namespace is divided by at least some of the plurality of zones. The controller is configured to receive a program request related to at least one application program executed by a host, to determine at least one zone designated by the at least one application program as an open state, and to control the memory device to perform a program operation on at least one memory block allocated for an open state zone.

11 Claims, 15 Drawing Sheets

(56) References Cited

U.S. PATENT DOCUMENTS

2021/0255803 A1\* 8/2021 Kanno .................. G06F 3/0619
2021/0255920 A1\* 8/2021 Bernat ................... G06F 9/461

OTHER PUBLICATIONS

Bjorling, Matias, Zone Append, A New Way of Writing to Zoned Storage. Western Digital. USENIX Vault (Feb. 23, 2020) (Year: 2020).\*
NVM Express 1.3 (May 1, 2017) (Year: 2017).\*
NMV Express Base Specification Revision 2.0 (May 13, 2021) (Year: 2021).\*
NVM Express Zoned Namespace Command Set Specification Revision 1.1 (Year: 2021).\*
Hellwig et al., 4053 Zoned Namespaces, Technical Proposal for New Feature, 2019, NVM Express Inc , Beaverton, USA.

\* cited by examiner

MEMORY SYSTEM WITH A ZONED NAMESPACE AND AN OPERATING METHOD THEREOF

CROSS-REFERENCE TO RELATED APPLICATION

This patent application claims priority to Korean Patent Application No. 10-2020-0022920, filed on Feb. 25, 2020, the entire disclosure of which is incorporated herein by reference.

TECHNICAL FIELD

Embodiments of this disclosure relate to a memory system, and more particularly, to an apparatus and a method for utilizing a single-level cell (SLC) buffer to increase the number of open zones in a zoned namespace of the memory system.

BACKGROUND

The computer environment paradigm has moved to ubiquitous computing systems that can support computer system access anytime and anywhere. Due to this, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Unlike a hard disk, a data storage device using a non-volatile semiconductor memory device has advantages such as excellent stability and durability, because it has no mechanical driving part (e.g., a mechanical arm), and has high data access speed and low power consumption. As an example of a memory system having such advantages, a data storage device includes a universal serial bus (USB) memory device, a memory card having various interfaces, a solid state drive (SSD) or the like.

SUMMARY

An embodiment of the disclosure provides a memory system, a data processing system, and an operation method, capable of quickly and reliably processing data into a memory device by reducing operational complexity and performance degradation of the memory system thereby enhancing usage efficiency of the memory device.

An embodiment of this disclosure provides a method and an apparatus for storing a piece of data, inputted from a host, in a single-level cell (SLC) buffer when a write buffer is full to increase the number of open zones among a plurality of zones.

In an embodiment, a memory system with at least one namespace may include a memory device including a plurality of single-level cell (SLC) buffers and a plurality of memory blocks, wherein each memory block includes a plurality of memory cells, each memory cell storing multi-bit data, and is allocated for a respective one of a plurality of zones, wherein each of the at least one namespace is divided into at least some of the plurality of zones; and a controller configured to receive a program request related to at least one application program executed by a host, to determine at least one zone designated by the at least one application program as an open state, and to control the memory device to perform a program operation on at least one memory block allocated for an open state zone. The controller can be configured to control the memory device to establish first, second and third open zones, and to assign a first region of a write buffer to the first open zone and a second region of the write buffer to the second open zone. When a target zone subject to a new program request is neither the first open zone nor the second open zone, the controller can be configured to determine which one of the first region and the second region is a victim, establish the open state zone associated with the victim as the third open zone, program data associated with the third open zone to a first SLC buffer among the plurality of SLC buffers, and store first data provided with the new program request to one of the first region and the second region, which is determined as the victim, in the write buffer.

The controller can be configured to control the memory device to read second data from a second SLC buffer, among the plurality of SLC buffers, based on information regarding the plurality of zones, when the second data corresponding to the target zone is stored in the second SLC buffer.

The first data can include a first piece of data and a second piece of data, and the first and second pieces of data are stored sequentially in the write buffer.

The controller can be configured to control the memory device to program the second piece of data to a target memory block corresponding to the target zone, while reading the second data.

The controller can be configured to control the memory device to program the second data and the first piece of data to the target memory block.

A first size of the second region associated with the second open zone can be equal to a second size of a group of memory cells programmed together. A third size of a region assigned for the target zone established as the first open zone can be greater than the second size.

The controller can be configured to determine the victim based on a priority. The priority, determined by the controller, can include: a first highest priority assigned to an implicitly open state zone; a second highest priority assigned to an open state zone associated with the smallest size of data stored in the first and second regions of the write buffer; and a third highest priority assigned to an open state zone associated with the oldest programmed data stored in the first and second regions of the write buffer.

The controller can be configured to release the second region determined as the victim, allocate the first region for a new second region, and split the first region into plural parts, each part having the same size as the group of memory cells programmed together.

The controller can be configured to update information regarding the plurality of zones after storing data associated with the victim in the first SLC buffer.

Data inputted from the host can be stored in the write buffer, and a size of the data inputted from the host can be less than a size of a group of memory cells programmed together.

In another embodiment, a method for operating memory system with at least one namespace can include receiving a program request related to at least one application program executed by a host; storing data inputted along with the program request in a write buffer or a plurality of single-level cell (SLC) buffers; determining at least one zone designated by the at least one application program, among a plurality of zones, as an open state; and performing a program operation on at least one memory block allocated for an open state zone. The open state zone can be established as first, second and third open zones, a first region of the write buffer is assigned to the first open zone, and a second region of the write buffer is assigned to the second open zone. The method can further comprise, when a target zone subject to a new program request is neither the first open zone nor the second open zone, determining which one of the first region and the second region is a victim, establishing the open state zone associated with the victim as the third open zone, programing data associated with the third open zone to a first SLC buffer among the plurality of SLC buffers, and storing first data provided with the new program request to one of the first region and the second region, which is determined as the victim, in the write buffer.

The method can further comprise reading second data from a second SLC buffer, among the plurality of buffers, based on information regarding the plurality of zones, when the second data corresponding to the target zone is stored in the second SLC buffer.

The first data can include a first piece of data and a second piece of data, and the first and second pieces of data can be stored sequentially in the write buffer.

The method can further comprise programming the second piece of data to a target memory block corresponding to the target zone, while reading the second data.

The method can further comprise programming the second data and the first piece of data to the target memory block.

A first size of the second region associated with the second open zone can be equal to a second size of a group of memory cells programmed together. A third size of a region assigned for the target zone established as the first open zone can be greater than the second size.

The victim can be determined based on a priority. The priority can include: a first highest priority assigned to an implicitly open state zone; a second highest priority assigned to an open state zone associated with the smallest size of data stored in the first and second regions of the write buffer; and a third highest priority assigned to an open state zone associated with the oldest programmed data stored in the first and second regions of the write buffer.

The method can further comprise releasing the second region determined as the victim; allocating the first region for a new second region; and splitting the first region into plural parts, each part having the same size with the group of memory cells programmed together.

The method can further comprise updating information regarding the plurality of zones after storing data associated with the victim in the first SLC buffer.

Data inputted from the host can be stored in the write buffer, and a size of the data inputted from the host can be less than a size of a group of memory cells programmed together.

In another embodiment, a memory system can include a memory device including at least one single-level cell (SLC) buffer and a plurality of zones, each zone including at least one memory block, each zone and/or each memory block accessible through at least one namespace; and a controller configured to receive a write request with data associated with the at least one namespace, establish a zone allocated for the at least one namespace, among the plurality of zones, as an open state zone, temporarily store the data in either a write buffer or the at least one SLC buffer based on information regarding the plurality of zones, and complete a program operation with the data stored in either the write buffer or the at least one single-level cell buffer to a memory block allocated for the open state zone.

The at least one memory block included in each zone can include a plurality of memory cells, each memory cell storing multi-bit data. Each of the at least one namespace can be divided into at least some of the plurality of zones.

The write buffer can be divided into plural regions, each region associated with each open state zone.

The controller can be configured to allocate a single region of the plural regions in the write buffer for other data inputted along with a new program request when the other data is associated with another zone, excluding the open state zone, among the plurality of zones.

The controller can be configured to deallocate at least one region of the plural regions when there is no available region in the write buffer.

The controller can be configured to transfer data stored in deallocated region of the plural regions to the at least one SLC buffer.

The controller can be configured to allocate deallocated region of the plural regions for the other data inputted along with the new program request.

The controller can be configured to assign a priority to the plural regions in the write buffer, and determine deallocated region based on the priority.

The priority can include a first highest priority assigned to an implicitly open state zone; a second highest priority assigned to an open state zone associated with the smallest size of data stored in the first and second regions of the write buffer; and a third highest priority assigned to an open state zone associated with the oldest programmed data stored in the first and second regions of the write buffer.

In another embodiment, a memory system can include a memory device including a single-level cell (SLC) buffer and a plurality of namespaces, each namespace including multiple zones, each zone including one or more multi-level cell (MLC) memory blocks; and a controller including a write buffer with multiple regions, each region corresponding to a respective one of the multiple zones, suitable for: when write data is received from a host, determining whether the write buffer is full; storing the write data in the SLC buffer, when it is determined that the write buffer is full; programming second data, which is stored in a second region of the write buffer, in a corresponding zone among the multiple zones, while reading the write data from the SLC buffer; and programming first data, which is stored in a first region of the write buffer before programming the second data, and the read write data in a corresponding zone among the multiple zones.

BRIEF DESCRIPTION OF THE DRAWINGS

The description herein makes reference to the accompanying drawings wherein like reference numerals refer to like parts throughout the figures.

Figure 1A:
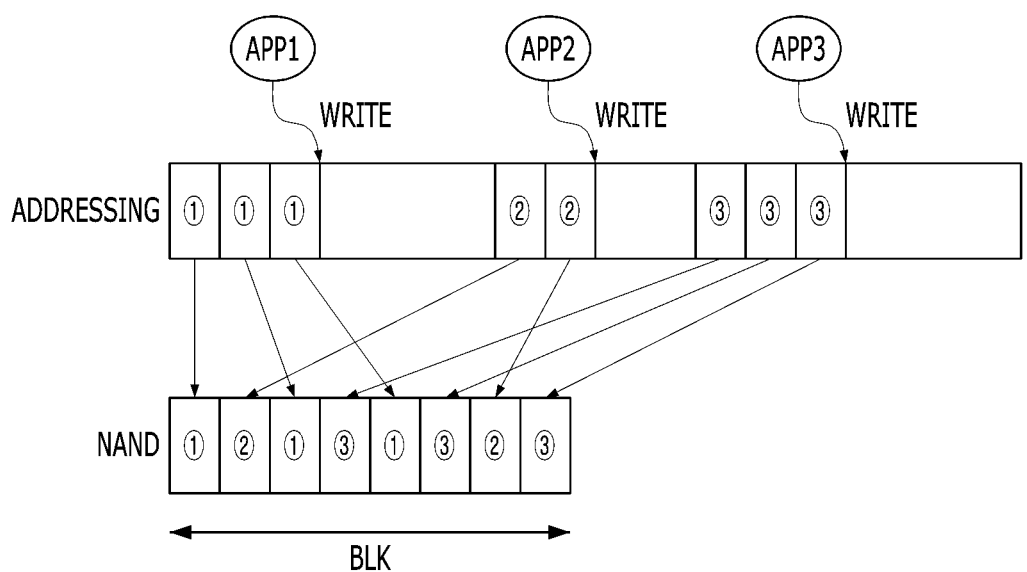
FIGS. 1A to 1C show operations of a memory system.

In this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements (e.g., an interface, circuitry, etc.).

In this disclosure, various units, circuits, or other components may be described or claimed as "configured to" perform a task or tasks. In such context, "configured to" is used to connote structure by indicating that the blocks/units/circuits/components include structure (e.g., circuitry) that performs one or more tasks during operation. As such, the block/unit/circuit/component can be said to be configured to perform a task even when the blocks/unit/circuit/component is not currently operational (e.g., is not on). The block/unit/circuit/component used with the "configured to" language may include hardware, for example, a circuit, memory storing program instructions executable to implement the operation, etc. Reciting that a block/unit/circuit/component is "configured to" perform one or more tasks is expressly intended not to invoke 35 U.S.C. § 112, sixth paragraph, for an interpretation of the block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/ software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that a first value must be written before a second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Technologies such as artificial intelligence (AI), big data and cloud may use a data center including a plurality of memory systems and handling (processing or storing) a lot of data within the plurality of memory systems. The data center can include a memory system implemented with a flash memory. A plurality of application programs can be operated or executed with a single memory system. A host coupled with the memory system executes the plurality of application programs. Herein, the host may be a computing device or a mobile phone. Each of the plurality of application programs may generate a piece of data and a logical block address (LBA) associated with the piece of data. The memory system may store plural pieces of data, associated with plural logical block addresses, in a single memory block of the flash memory. The memory system may store plural pieces of data provided from the plurality of application programs in the single memory block, and then generate map data associating logical block addresses corresponding to the plural pieces of data with physical addresses of the single the memory block.

Figure 1B:
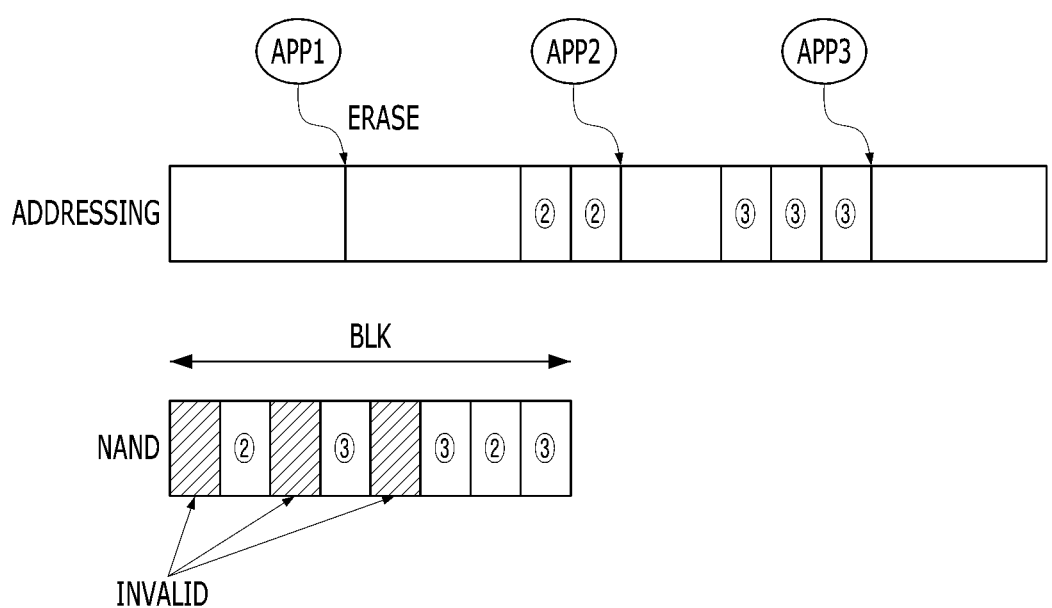
Figure 1C:
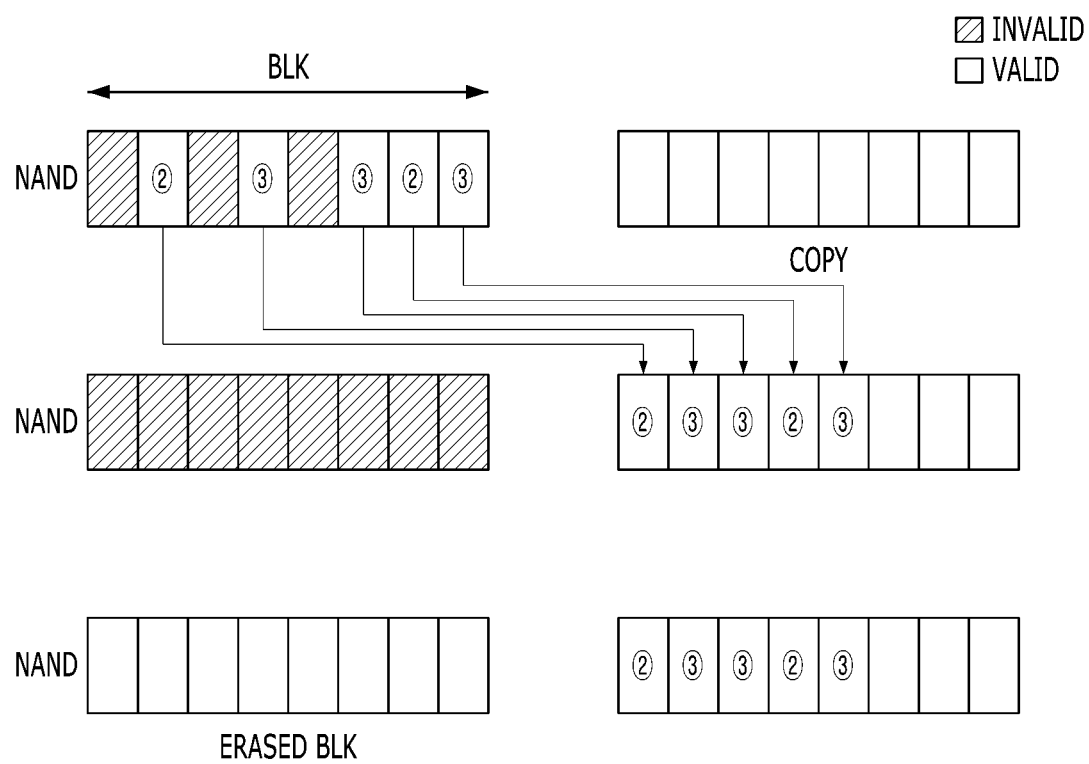

FIGS. 1A to 1C show operations of a memory system. FIG. 1A illustrates an example in which three application programs are driven with a single memory block in the memory system.

A plurality of logical block addresses covering a storage capability of the single memory system can be divided into zones, each zone assigned to the three application programs. Each of the three application programs may associate a logical block address in an assigned zone for a piece of data generated by each application program. In the illustrated example of FIG. 1A, a first application program APP1 may generate three pieces of first data ①, assign three logical block addresses, among the plurality of logical block addresses, to the three pieces of first data ①, and try to store the three pieces of first data ① in a memory device (e.g., NAND) of the memory system. A second application program APP2 may generate two pieces of second data ②, assign two other logical block addresses to the two pieces of second data ②, and try to store the two pieces of second data ② in the memory system. Likewise, a third application program APP3 may generate three pieces of third data ③, assign three logical block addresses, among the plurality of logical block addresses, to the three pieces of third data ③, and try to store the three pieces of third data ③ in the memory system. The memory system may program the first, second and third data ①, ②, ③ in different locations of a single memory block BLK of the memory device. The single memory block BLK may include plural regions, with a different region exclusively assigned to each of the first to third application programs APP1-APP3. Accordingly, the memory block BLK may store all data stored by each of the first to third application programs APP1-APP3.

FIG. 1B shows an erase operation in the memory system when the first application program APP1 erases at least one piece of data which has been stored in the memory block BLK.

In the memory system, read and program operations may be performed in a page basis (i.e., page-by-page), but an erase operation may be performed in a block basis (i.e., block-by-block). The page may be a group of memory cells read or programmed together, and the memory block may be a group of memory cells erased together. The memory block includes a plurality of pages. When plural pieces of data provided from a plurality of application programs are stored in the single memory block BLK, the first application APP1 may issues an erase command regarding some data programmed or stored in the memory block BLK. In response to the erase command, the memory system may invalidate (or erase) the data associated with the erase command and notify the first application APP1 of the erased state. In the illustrated example of FIG. 1B, the three pieces of first data ① among plural pieces of data in the memory block BLK are invalidated (INVALID), but the second and the third data ②, ③ stored by the second and third application programs APP2 and APP3 are still valid. As a size of invalid data in the memory block increases, available storage capacity of the memory system may decrease. Thus, the memory system may perform a garbage collection operation to convert a region in which invalid data is stored into an available region for storing other data.

FIG. 1C is a diagram illustrating a garbage collection operation to the memory block BLK.

The memory system may copy valid data stored in the memory block BLK to an empty memory block (or a free block). In the illustrated example of FIG. 1C, the memory system copies the second and the third data ②, ③ associated with the second and third application programs APP2, APP3, i.e., valid data, to an empty memory block. Invalid data associated with the first application program APP1 might be not copied to the empty memory block. After the valid data in the memory block BLK is copied to an empty memory block, the memory system may invalidate all data stored in the memory block BLK and perform an erase operation on the memory block BLK. After copying only valid data from the memory block, storing invalid and valid data, into an empty memory block, the memory system may perform an erase operation to the memory block to complete the garbage collection operation to secure a new free block.

An amount of invalid data stored in a memory block may increase whenever an erase command generated by an application program is inputted. When the garbage collection for removing invalid data in the memory system is performed, read and program operations that are in progress may be temporarily stopped or delayed, which may decrease service quality (e.g., input and output (I/O) throughput). A data processing system utilizing a zoned namespace (ZNS) can avoid the performance degradation issue caused by interference between the garbage collection and one or more other data I/O operations.

Figure 2:
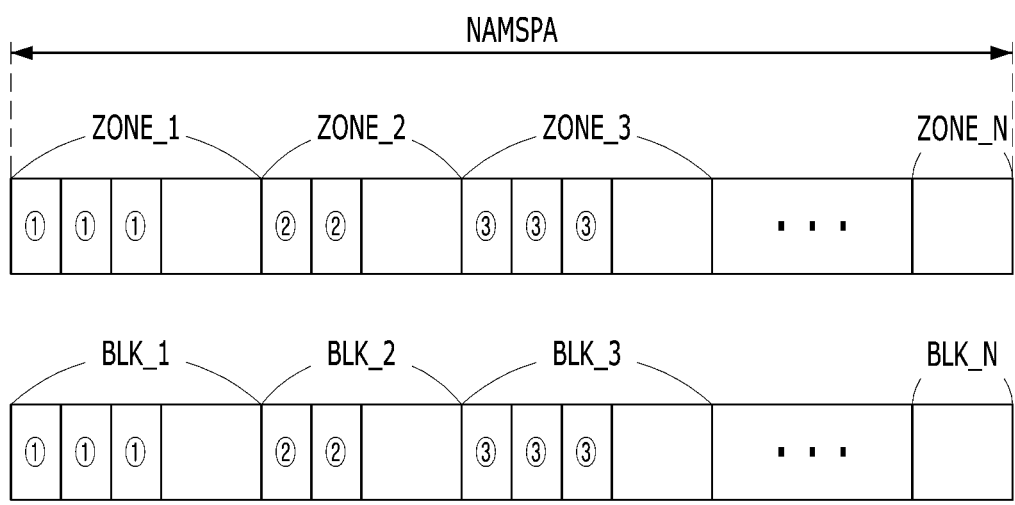
FIG. 2 shows a storage method of a data processing system using a zoned namespace.

FIG. 2 is a diagram illustrating a storage method of a data processing system using a zoned namespace.

The zoned namespace (ZNS) refers to a technique of dividing a namespace into plural zones. A namespace refers to an amount of storage in a non-volatile memory that can be formatted as a logical structure or a logical unit. A disk drive (e.g., "C:/" or "D:/") in a personal computing device may be an example of a namespace. In the data processing system using a zoned namespace, each zone is allocated for a corresponding application program so that a plurality of application programs may individually store their data with sequential logical block addresses assigned to each zone. Not only are logical block addresses grouped into plural parts corresponding to the plural zones, but a storage region of the memory system is also divided into physical regions corresponding to the plural zones. Because a single zone may store plural pieces of data generated or associated with the same application, attributes or properties of the plural data stored in the single zone can be similar. Also, logical block addresses in each zone can be continuous. In a memory system with a zoned namespace, at least one memory block allocated for each zone can be programmed sequentially.

In the illustrated example of FIG. 2, a namespace NAMSPA may be divided into a plurality of zones ZONE_1 to ZONE_N. In an embodiment, each of the plurality of zones ZONE_1 to ZONE_N may have the same size. A single application program may use a single zone. In another embodiment, a single application program may use plural zones to store plural pieces of data generated by itself. In each zone, a plurality of consecutive logical block addresses is assigned. A storage inside the memory device can be also divided into plural regions respectively corresponding to the plurality of zones ZONE_1 to ZONE_N so that each zone in a logical domain may correspond to a respective one of the regions in a physical domain. A storage size of each zone is the same as a size of the region physically divided from the storage of the memory device. Further, each zone may include a plurality of memory blocks, each memory block including a plurality of memory cells erased together. For example, a single zone, e.g., ZONE_1, ZONE_2, ZONE_3, may individually include a single memory block, e.g., BLK_1, BLK_2, BLK_3. First to Nth memory blocks BLK_1 to BLK_N illustrated in FIG. 2 may be allocated for first to Nth zones ZONE_1 to ZONE_N, respectively.

For example, it can be assumed that the first to the third application programs APP1 to APP3 individually use the first to the third zones ZONE_1 to ZONE_3, respectively. The first application APP1 uses the first zone ZONE_1 to store data, and logical block addresses assigned to the first zone ZONE_1 are contiguous. The host may provide a program command with program data and identification information regarding a zone. Based on the identification information, the memory system may sequentially program the program data associated with logical block addresses assigned to the first zone ZONE_1 in the first memory block BLK_1 allocated for the first zone ZONE_1.

Likewise, a piece of data associated with the second zone ZONE_2 or the third zone ZONE_3 may be stored in the second memory block BLK_2 or the third memory block BLK_3 by another application program such as the second or the third application program APP2, APP3. In a case of a memory system provided with a zoned namespace, a piece of data provided from a different application program may be stored in a different region of the memory device which is associated with one of the plural zones. Therefore, an erase command to erase some data stored in a specific region of the memory device, generated by an application program, may not affect another region allocated for storing data generated or managed by another application program.

In a case of a memory system with a zoned namespace, plural pieces of data are sequentially stored in a memory block associated with a zone, which zone may be deleted by a specific application program, so that a garbage collection operation may be unnecessary. Thus, a write amplification factor (WAF) of the memory system with the zoned namespace may have a very low value (e.g., close to 1). Herein, the WAF may indicate overhead or an additional program operation occurring in the memory system for an internal matter such as garbage collection generating an addition program operation. The WAF may be obtained by dividing an amount of first program data, which is programmed in the memory device, by an amount of second program data which is requested by an external device such as the host. As the number of garbage collection operations and/or the size of data copied through the garbage collection operations decrease, the WAF may be close to a value of '1'.

A non-volatile storage of the memory system may have a limited lifespan, e.g., the number of times it can be programmed may be limited. In a case of the memory system with the zoned namespace, an additional program operation caused by the garbage collection operation may be reduced so as to increase the lifespan of the memory system. In addition, a size of over-provision area in the memory system may be reduced. The over-provision area is a spare area in the memory device, which is not recognized as a storage by an external device or the host. The over-provision area may be used for a background operation of the memory system such as the garbage collection.

In a conventional memory system storing map data such as a table of associating logical block addresses with physical addresses, a controller should load the map data in a volatile memory for a data I/O operation. However, in an embodiment of the memory system with the zoned namespace, the controller may control the memory device based on the plural zones so that the controller may load map data corresponding to a zone, not to all of the plural zones, for a data I/O operation requested by a corresponding application program. In another embodiment of the memory system with the zoned namespace, each memory block may be matched with a corresponding zone, and plural pieces of data associated with sequential logical block addresses may be sequentially programmed in one or more memory blocks, each corresponding to its own zone. In this embodiment, map data may not be necessary because each zone is established to have the same size of a memory block in the memory device and plural pieces of data are sequentially programmed in each memory block. Thus, the memory system with the zoned namespace may efficiently use the volatile memory for a data I/O operation.

An amount of data provided by the host to the memory system at a time may be different from a size of data programmed once in the memory system, i.e., a single programming shot. For example, in a case of a TLC memory device, a size of data programmed once may be up to three pages, i.e., a sum of the sizes of a least significant bit (LSB) page, a central significant bit (CSB) page, and a most significant bit (MSB) page. Further, as storage capability of the memory device increases, a size of each page may increase. Because the host may transfer write data corresponding to a single logical block address, an amount of write data is less than that stored in three pages of the memory device. Therefore, the memory system may temporarily store program data, transferred from the host many times, in a write buffer of the controller. When an amount of stored program data reaches the size of data for a programming shot, the controller may program the stored program data in a memory block of the memory device. The memory system may allocate a part of the write buffer for a zone. The write buffer may be split into plural regions, each region corresponding to each zone. According to an embodiment, a size of each region allocated for a corresponding zone may be equal to the size of data programmed once in the memory device. Further, an open state zone may indicate a zone for which the controller allocates a region of the write buffer. The memory system may perform a program operation to a memory block through the open state zone only.

Because the write buffer is included in a volatile memory, data stored in the write buffer would be lost when power to the memory system is interrupted or turned off. Accordingly, the memory system may include an emergency power supply. When a power failure occurs, the memory system may use a power supplied through the emergency power supply to back up the data stored in the write buffer in a non-volatile memory. A time available for backing up the data through the emergency power supply may be limited. During that limited time, an amount of data that the memory system can back up from the write buffer to the non-volatile memory is also limited. Therefore, a size of the write buffer may be determined based on the size of data that can be backed up during that time when a power is supplied through the emergency power supply. Because the size of the write buffer is limited, the number of open state zones for which regions of the write buffer are allocated is also limited. Thus, the number of open state zones simultaneously managed by the controller is limited. When the number of open state zones is limited, the number of application programs that can run simultaneously may be limited. When a host or a computing device operating in, or engaged with, a data center including the memory system, the number of application programs simultaneously run may be restricted due to the memory system. The memory system with the zoned namespace may be requested to provide a data I/O operation regardless of the number of application programs simultaneously run.

Figure 3:
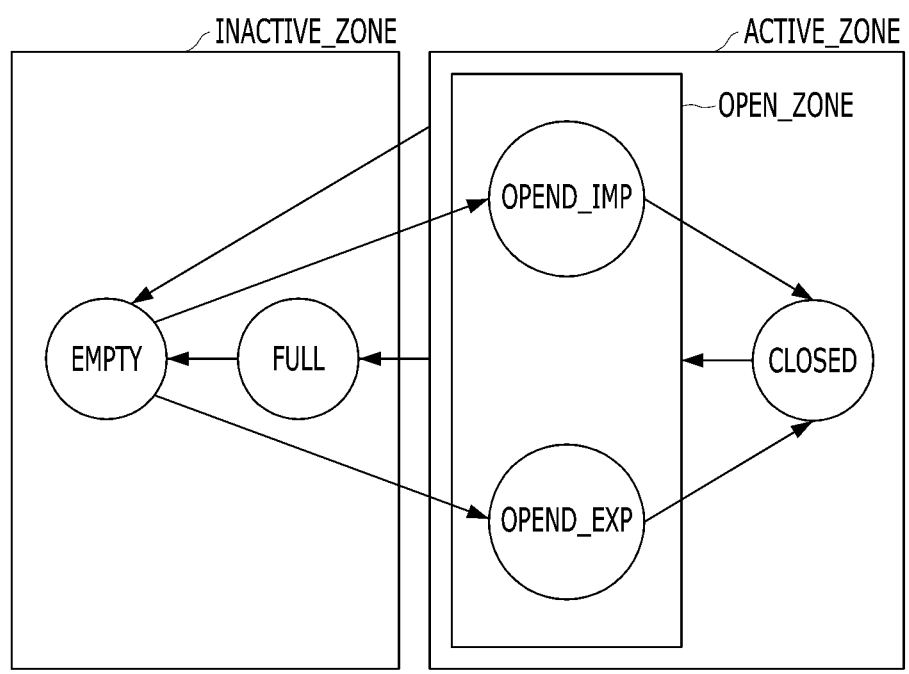
FIG. 3 shows operation statuses of zones in the memory system.

FIG. 3 is a diagram illustrating states of zone.

Referring to FIG. 3, each of the plural zones assigned to plural storage regions of a memory system may be an active zone ACTIVE_ZONE or an inactive zone INACTIVE_ZONE, according to an operation status. The active zone ACTIVE_ZONE may include an open state zone OPEN_ZONE and a closed state zone CLOSED. The inactive zone INACTIVE_ZONE may include an empty zone EMPTY and a full zone FULL. The number of open state zones may be limited based at least on storage capacity of the write buffer as described above. In addition, the number of closed state zones or the number of active zones may be also limited.

The open state zone OPEN_ZONE includes an explicitly opened zone OPENED_EXP and an implicitly opened zone OPENED_IMP. A host may explicitly provide a command for requesting the memory system to make a specific zone an open state zone. The open state zone designated by host's command may be the explicitly opened zone OPENED_EXP. When the host does not send the command for designating a specific zone but a program request with identification information for the specific zone to the memory system, the memory system may determine which zone is converted into the open state zone based on the identification information and perform a program operation corresponding to the program request. The open state zone determined by the memory system may be an implicitly opened zone OPENED_IMP. When all regions of the write buffer are individually allocated for a plurality of open state zones, a program command regarding a zone other than the current open state zones may be inputted. In this case, the memory system may convert any one of the open state zones into a closed state zone CLOSED. Herein, the closed state zone can be converted from the open state zone.

When all pages in a memory block corresponding to the open state zone are programmed with data, the memory system may convert the open state zone OPEN_ZONE into the closed state zone CLOSED. Later, the closed state zone CLOSED may be converted into the full zone FULL. Herein, the full zone FULL may indicate a specific zone in which no empty or blank page exists in a memory block corresponding to that zone. When an application program sends an erase command regarding a full zone or an active zone to the memory system, the memory system may perform an erase operation on a memory block corresponding to a zone associated with the erase command so that the zone can be empty (i.e., erased). The empty zone EMPTY may indicate a specific zone in which a corresponding memory block is erased, i.e., empty.

As described above, the number of zones controlled as the active zone ACTIVE_ZONE may be limited. When all regions of the write buffer has been allocated for the current open state zones and the number of closed state zones cannot be increased any more in the memory system, the host may execute a new application program which needs a new open state zone for a data I/O operation. When the memory system is no longer able to create or allocate a new open state zone for the new application, the new application program may be executed with a delay and a performance of the data processing system may be degraded. There is an issue that the number of simultaneously executable application programs can be limited when the number of zones in the active zone reaches a threshold.

Figure 4:
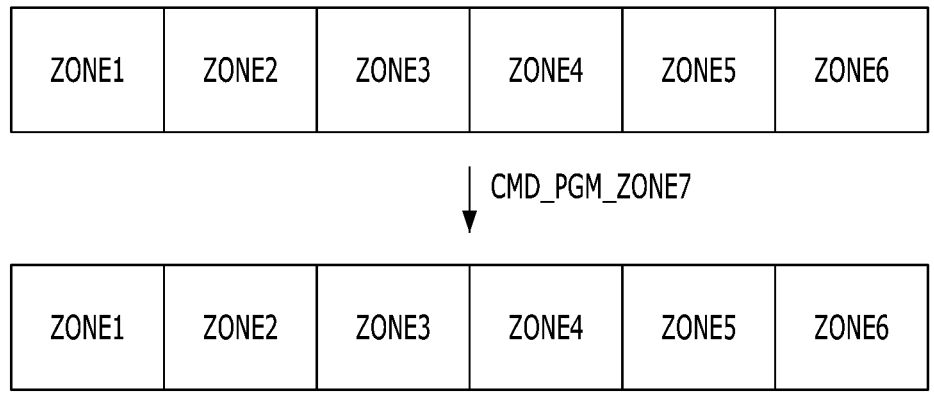
FIG. 4 is a diagram for describing an issue as to why the number of applications simultaneously carried out may be limited.

FIG. 4 is a diagram for describing an issue that the number of application programs that can be simultaneously executed is limited.

In the illustrated example of FIG. 4, a write buffer includes 6 regions, each region allocated to a respective one of six different zones ZONE1 to ZONE6, and the number of closed state zones reaches a threshold, i.e., an allowable number of closed state zones.

As described above, a size of each region in the write buffer, which is allocated to the open state zone, may be an amount of data programed once in a memory device, and the size of each region is the same as the size of its corresponding open state zone. In the illustrated example, FIG. 4 shows a case where six regions of the write buffer have been allocated to the first to sixth zones ZONE1 to ZONE6, respectively. In each region of the write buffer, program data associated with the corresponding zone may be temporarily stored. The number of closed state zones may reach the threshold so that no other zone may transition into a new closed state zone. In this case, a new command or a new request associated with another zone (e.g. a seventh zone ZONE7) is inputted to the memory system. Herein, it is assumed that the seventh zone ZONE7 is requested as an open state zone, not a closed state zone.

When an application program corresponding to the seventh zone ZONE7 provides a program command CMD_PGM_ZONE7 to the memory system, the memory system may first try to convert one of the first to the sixth zones ZONE1 to ZONE6, which are open state zones, into a closed state zone, release a region of the write buffer associated with the converted zone, and allocate a released region of the write buffer for the seventh zone ZONE7 which is a new open state zone. However, since the number of closed state zones is already at the threshold, the memory system may not convert any one of the first to the sixth zones ZONE1 to ZONE6 to a new closed state zone. Thus, the memory system may not allocate any region of the write buffer for the seventh zone ZONE7 associated with the program command CMD_PGM_ZONE7, so that a program operation corresponding to the program command CMD_PGM_ZONE7 may not be performed.

Figure 6:
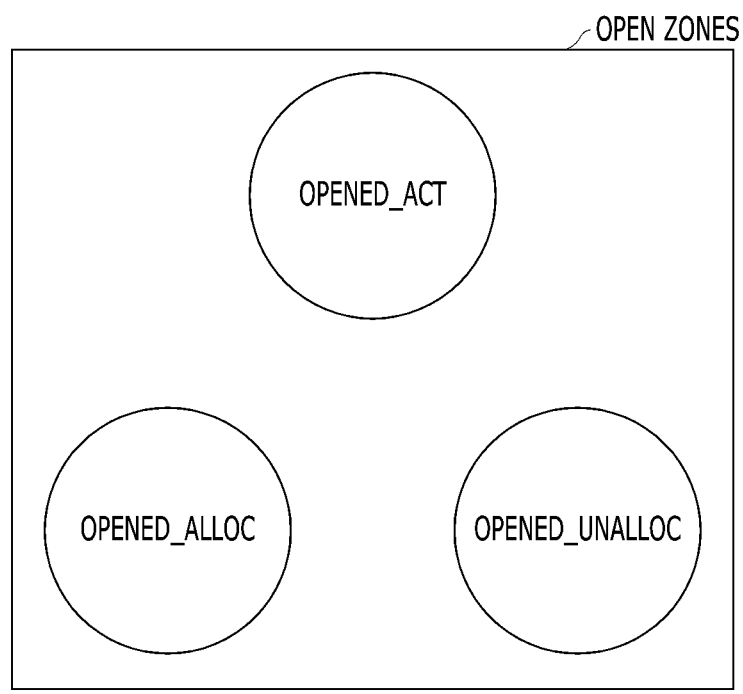
FIG. 6 is a diagram illustrating first to third open zones according to an embodiment of the disclosure.

In some embodiments, the memory system may subdivide an open state zone into two or more open zones, e.g., a first to a third open zones, as shown in FIG. 6. In FIG. 6, the first open zone OPENDED_ACT may correspond to a command or a request which is the most recently received by the memory system, the second open zone OPENED_ALLOC may be for which a region of the write buffer is allocated, and the third open zone OPENDED_UNALLOC may be for any region of the write buffer is not allocated. When the number of active zones reaches a threshold and it is required that a region of the write buffer be allocated for a new zone, the memory system may determine which one of second open zones OPEN_ALLOC is a target zone, change one of the second open zones OPEN_ALLOC into the third open zone OPENDED_UNALLOC, and program data stored in a region of the write buffer, allocated for the target zone, in a SLC buffer of the memory device. Thereafter, when receiving a program command for the target zone, the memory system can change the target zone into the first open zone OPEN_ACT, loads the data stored in the SLC buffer, organize loaded data and new program data, associated with the program command, as a unit programmed in a memory block, and then program organized data in the memory block. For example, the memory block may include multi-level memory cells, each cell capable of storing multi-bit data. According to an embodiment of the disclosure, the memory system may use the SLC buffer as a write buffer so as to support a greater number of concurrently running application programs requesting the memory system to store data than the number of open state zones limited based on a size of the write buffer.

Figure 5:
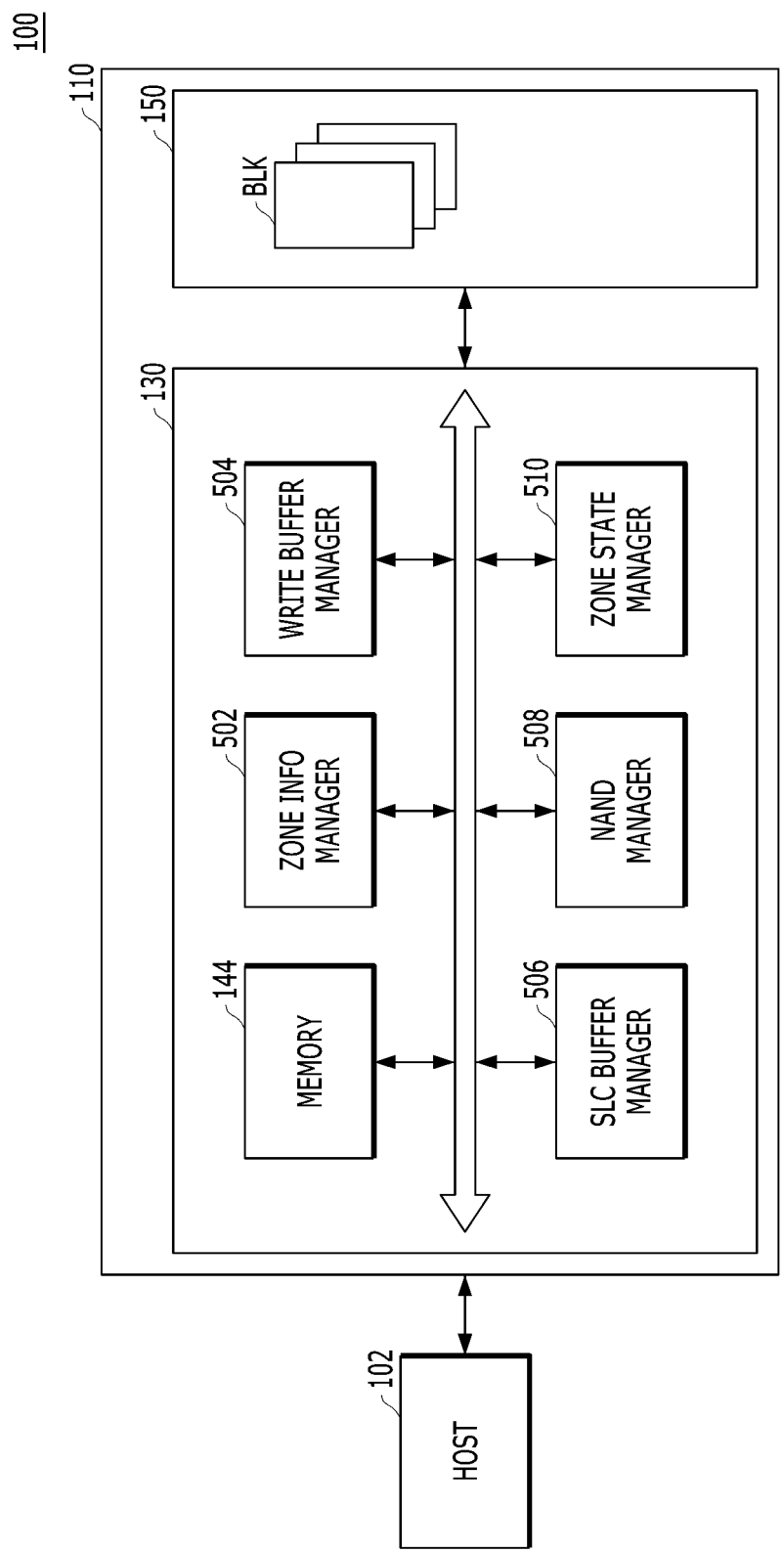
FIG. 5 is a block diagram illustrating a data processing system according to an embodiment of the present invention.

FIG. 5 illustrates a data processing system 100 in accordance with an embodiment of the disclosure. Referring to FIG. 5, the data processing system 100 may include a host 102 engaged or operably coupled with a memory system 110.

The host 102 may include, for example, a portable electronic device such as a mobile phone, an MP3 player and a laptop computer, or a non-portable electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user needing and using the memory system 110. The OS may support functions and operations corresponding to a user's requests. By way of example but not limitation, the OS can include a general operating system and a mobile operating system according to mobility of the host 102. The general operating system may be split into a personal operating system and an enterprise operating system according to system requirements or a user's environment. But the enterprise operating systems can be specialized for securing and supporting high performance computing. The mobile operating system may be subject to support services or functions for mobility (e.g., a power saving function). The host 102 may include a plurality of operating systems. The host 102 may execute multiple operating systems operably coupled with the memory system 110, corresponding to a user's request. The host 102 may transmit a plurality of commands corresponding to the user's requests into the memory system 110, thereby performing operations corresponding to commands within the memory system 110.

The controller 130 in the memory system 110 may control the memory device 150 in response to a request or a command inputted from the host 102. For example, the controller 130 may perform a read operation to provide a piece of data read from the memory device 150 for the host 102, and perform a write operation (or a program operation) to store a piece of data inputted from the host 102 in the memory device 150. In order to perform data input/output (I/O) operations, the controller 130 may control and manage internal operations for data read, data program, data erase, or the like.

Components in the controller 130 may vary according to implementation, desired operation performance, or the like of the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Additional component(s) may be included in the controller 130 and/or one or more of those identified above may be omitted based on implementation of the memory system 110.

The host 102 and the memory system 110 may include a controller or an interface for transmitting and receiving signals, data, and the like, according to a specific protocol. Examples of such protocols or interfaces include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe), Serial-attached SCSI (SAS), Serial Advanced Technology Attachment (SATA), Mobile Industry Processor Interface (MIPI), and the like. According to an embodiment, the host interface 132 is a kind of layer for exchanging data with the host 102 and is implemented with, or driven by, firmware called a host interface layer (HIL).

Integrated Drive Electronics (IDE) or Advanced Technology Attachment (ATA), used as one of the interfaces for transmitting and receiving a piece of data, can use a cable including 40 wires connected in parallel to support data transmission and reception between the host 102 and the memory system 110. When a plurality of memory systems 110 are connected to a single host 102, one of the plurality of memory systems 110 may be considered a master and the others may be considered a slave. Such configuration may be made by using a position or a dip switch to which the plurality of memory systems 110 are connected. The memory system 110 set as the master may be used as the main memory device. The IDE has evolved into Fast-ATA, ATAPI, and Enhanced IDE (EIDE).

Serial Advanced Technology Attachment (SATA) is a kind of serial data communication interface that is compatible with various ATA standards of parallel data communication interfaces which is used by Integrated Drive Electronics (IDE) devices. 40 wires in the IDE interface can be reduced to 6 wires in the SATA interface. For example, 40 parallel signals for the IDE can be converted into 6 serial signals for the SATA to be transmitted between each other. The SATA has been widely used because of its faster data transmission and reception rate and its lower resource consumption in the host 102 used for data transmission and reception. The SATA may support connection with up to 30 external devices to a single transceiver in the host 102. In addition, the SATA can support hot plugging that allows an external device to be attached or detached from the host 102 even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely detached like an external hard disk.

Small Computer System Interface (SCSI) is a kind of serial data communication interface used for connection between a computer, a server, and/or another peripheral device. The SCSI can provide a high transmission speed, as compared with other interfaces such as the IDE and the SATA. In the SCSI, the host 102 and at least one peripheral device (e.g., the memory system 110) are connected in series, but data transmission and reception between the host 102 and each peripheral device may be performed through a parallel data communication. In the SCSI, it is easy to connect to, or disconnect from, the host 102 a device such as the memory system 110. The SCSI can support connections of 15 other devices to a single transceiver included in host 102.

Serial Attached SCSI (SAS) can be understood as a serial data communication version of the SCSI. In the SAS, not only the host 102 and a plurality of peripheral devices are connected in series, but also data transmission and reception between the host 102 and each peripheral device may be performed in a serial data communication scheme. The SAS can support connection between the host 102 and the peripheral device through a serial cable instead of a parallel cable, so as to easily manage equipment using the SAS and enhance or improve operational reliability and communication performance. The SAS may support connections of eight external devices to a single transceiver included in the host 102.

Non-volatile memory express (NVMe) is a kind of interface based at least on a Peripheral Component Interconnect Express (PCIe) designed to increase performance and design flexibility of the host 102 (or servers, computing devices, and the like), which is equipped with the memory system 110. Here, the PCIe can use a slot or a specific cable for connecting the host 102, such as a computing device, and the memory system 110, such as a peripheral device. For example, the PCIe can use a plurality of pins (for example, 18 pins, 32 pins, 49 pins, 82 pins, etc.) and at least one wire (e.g. ×1, ×4, ×8, ×16, etc.), to achieve high speed data communication over several hundred MB per second (e.g. 250 MB/s, 500 MB/s, 984.6250 MB/s, 1969 MB/s, and etc.).

According to an embodiment, the PCIe scheme may achieve bandwidths of tens to hundreds of Giga bits per second (Gbps). A system using the NVMe can make the most of an operation speed of the nonvolatile memory system 110, such as an SSD, which operates at a higher speed than a hard disk.

According to an embodiment, the host 102 and the memory system 110 may be connected through a universal serial bus (USB). The Universal Serial Bus (USB) is a kind of scalable, hot-pluggable plug-and-play serial interface that can provide cost-effective standard connectivity between the host 102 and a peripheral device such as a keyboard, a mouse, a joystick, a printer, a scanner, a storage device, a modem, a video camera, and the like. A plurality of peripheral devices such as the memory system 110 may be coupled to a single transceiver in the host 102.

The controller 130 may include an interface for handling commands and data transferred between the controller 130 and the memory device 150. According to an embodiment, the interface may support an open NAND flash interface (ONFi), a toggle mode or the like for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), and a toggle double data rate (DDR).

The memory system 110 may have the zoned namespace described above with reference to FIG. 2. Accordingly, each of the memory blocks in the memory device 150 may be associated with a respective one of a plurality of zones. Plural pieces of data may be sequentially programmed in each memory block.

The controller 130 may include a zone information manager 502, a write buffer manager 504, an SLC buffer manager 506, a NAND manager 508, a zone state manager 510, and a memory 144. According to an embodiment, the zone information manager 502, the write buffer manager 504, the SLC buffer manager 506, the NAND manager 508, the zone state manager 510 may be implemented with circuitry for performing a task. In an embodiment, two or more of the zone information manager 502, the write buffer manager 504, the SLC buffer manager 506, the NAND manager 508, and the zone state manager 510 may be combined into a single component.

The memory 144 may be a sort of working memory in the memory system 110 or the controller 130, while storing temporary or transactional data occurred or delivered for operations in the memory system 110 and the controller 130. For example, the memory 144 may temporarily store a piece of read data outputted from the memory device 150 in response to a request from the host 102, before the piece of read data is outputted to the host 102. In addition, the controller 130 may temporarily store a piece of write data inputted from the host 102 in the memory 144, before programming the piece of write data in the memory device 150. When the controller 130 controls operations such as data read, data write, data program, data erase of the memory device 150, a piece of data transmitted or generated between the controller 130 and the memory device 150 of the memory system 110 may be stored in the memory 144. In addition to the piece of read data or write data, the memory 144 may store information (e.g., map data, read requests, and program requests) necessary for performing operations for inputting or outputting a piece of data between the host 102 and the memory device 150. According to an embodiment, the memory 144 may include a command queue, a program memory, a data memory, a write buffer/cache, a read buffer/cache, a data buffer/cache, and a map buffer/cache. The write buffer may be used to temporarily store a piece of target data subject to a program operation.

In an embodiment, the memory 144 may be implemented with a volatile memory. For example, the memory 144 may be implemented with a static random access memory (SRAM), a dynamic random access memory (DRAM), or both. Although FIG. 1 illustrates, for example, the memory 144 disposed within the controller 130, the invention is not limited thereto. The memory 144 may be located within or external to the controller 130. For instance, the memory 144 may be embodied by an external volatile memory having a memory interface transferring data and/or signals between the memory 144 and the controller 130.

When the memory device 150 includes a plurality of dies (or a plurality of chips) including non-volatile memory cells, the controller 130 may be configured to perform a parallel processing regarding plural requests or commands inputted from the host 102 in order to improve performance of the memory system 110. For example, the transmitted requests or commands may be divided and processed simultaneously into a plurality of dies or a plurality of chips in the memory device 150. When the controller 130 distributes and stores pieces of data in the plurality of dies through each channel or each way in response to requests or a commands associated with a plurality of pages including nonvolatile memory cells, plural operations corresponding to the requests or the commands can be performed simultaneously or in parallel. Such a processing method or scheme can be considered as an interleaving method. Because data input/output speed of the memory system 110 operating with the interleaving method may be faster than that without the interleaving method, data I/O performance of the memory system 110 can be improved.

By way of example but not limitation, the controller 130 can recognize statuses regarding a plurality of channels (or ways) associated with a plurality of memory dies in the memory device 150. The controller 130 may determine the status of each channel or way as a busy status, a ready status, an active status, an idle status, a normal status, and/or an abnormal status. The controller's determination of which channel or way an instruction (and/or data) is delivered through can be associated with a physical block address, e.g., which die(s) the instruction (and/or the data) is to be delivered into. The controller 130 can refer to descriptors delivered from the memory device 150. The descriptors can include a block or page of parameters that describe relevant characteristics of the memory device 150, which is data with a predetermined format or structure. Herein, the predetermined format or structure may be determined based on a protocol or settled specification between components. For instance, the descriptors may include device descriptors, configuration descriptors, and unit descriptors. The controller 130 can refer to, or use, the descriptors to determine which channel(s) or way(s) an instruction or a data is exchanged via.

In FIG. 5, the memory device 150 in the memory system 110 may include the plurality of memory blocks BLK. Each of the plurality of memory blocks BLK includes a plurality of nonvolatile memory cells. According to an embodiment, the memory block BLK can be a group of nonvolatile memory cells erased together. The memory block BLK may include a plurality of pages which is a group of nonvolatile memory cells read or programmed together. Although not shown in FIG. 5, each memory block BLK may have a three-dimensional stack structure for high integration. Further, the memory device 150 may include a plurality of dies, each die including a plurality of planes, each plane including the plurality of memory blocks BLK. Configuration of the memory device 150 can be different depending on desired performance of the memory system 110.

In the memory device 150 shown in FIG. 5, the plurality of memory blocks BLK are included. The plurality of memory blocks BLK can be any of different types of memory blocks such as a single-level cell (SLC) memory block, and a multi-level cell (MLC) memory block, according to the number of bits that can be stored or represented in one memory cell. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in terms of storage capacity. In an embodiment, the memory device 150 may be implemented with MLC memory blocks such as a double level cell (DLC) memory block, a triple-level cell (TLC) memory block, a quadruple-level cell (QLC) memory block and a combination thereof. The double-level cell (DLC) memory block may include a plurality of pages implemented by memory cells, each capable of storing 2-bit data. The triple-level cell (TLC) memory block can include a plurality of pages implemented by memory cells, each capable of storing 3-bit data. The quadruple-level cell (QLC) memory block can include a plurality of pages implemented by memory cells, each capable of storing 4-bit data. In another embodiment, the memory device 150 can be implemented with a block including a plurality of pages implemented by memory cells, each capable of storing five or more bits of data.

According to an embodiment, the controller 130 may use a multi-level cell (MLC) memory block in the memory system 150 as an SLC memory block that stores one-bit data in one memory cell. A data input/output speed of a multi-level cell (MLC) memory block can be slower than that of a SLC memory block. That is, when an MLC memory block is used as an SLC memory block, a margin for a read or program operation can be reduced. The controller 130 can utilize a faster data input/output speed of the multi-level cell (MLC) memory block when using a multi-level cell (MLC) memory block as the SLC memory block. For example, the controller 130 can use an MLC memory block as a buffer to temporarily store a piece of data, because the buffer may require a high data input/output speed for improving performance of the memory system 110.

According to an embodiment, the controller 130 may program pieces of data in a multi-level cell (MLC) a plurality of times without performing an erase operation on the corresponding MLC memory block in the memory system 150. In general, nonvolatile memory cells have a feature that does not support data overwrite. However, the controller 130 may use a feature in which a multi-level cell (MLC) may store multi-bit data, in order to program plural pieces of 1-bit data in the MLC a plurality of times. For MLC overwrite operation, the controller 130 may store the number of program times as separate operation information when a piece of 1-bit data is programmed in a nonvolatile memory cell. According to an embodiment, an operation for uniformly levelling threshold voltages of nonvolatile memory cells can be carried out before another piece of data is overwritten in the same nonvolatile memory cells.

In an embodiment of the disclosure, the memory device 150 is embodied as a nonvolatile memory such as a flash memory, for example, as a NAND flash memory, or a NOR flash memory. Alternatively, the memory device 150 may be implemented by at least one of a phase change random access memory (PCRAM), a ferroelectrics random access memory (FRAM), a spin injection magnetic memory (SU-RAM), and a spin transfer torque magnetic random access memory (STT-MRAM).

According to an embodiment, the memory system 110 may establish plural zones for supporting a zoned namespace. The memory device 150 may include at least two different types of memory blocks: one (e.g., SLC memory block) is used for a buffer temporarily storing data, and the other (e.g., TLC memory block) is used for data storage which stores data continuously. The host 102 may transfer a write request (or a program request) with a zone identifier. The zone identifier may indicate one of plural zones associated with at least one namespace. The controller 130 can receive a write request with data associated with the at least one namespace. The controller 130 can establish a zone allocated for the at least one namespace, among the plurality of zones, as an open state zone. Based on information regarding the plurality of zones, the controller 130 can temporarily store program data in either a write buffer or the at least one SLC buffer. The controller 130 can allocate regions of write buffer for some of the plural zones, based on states of the plural zones. Herein, the number of regions of write buffer may be limited so that the controller 130 assigns or releases a region of write buffer to or from an open state zone. The controller 130 can complete a program operation with the data stored in either the write buffer or the at least one single-level cell buffer to a memory block which is allocated for the open state zone.

FIG. 6 is diagram illustrating first to third open zones according to an embodiment of the disclosure.

Referring to FIG. 6, the first open zone OPENED_ACT is for the program command most recently received by the memory system 110. Thus, a single zone only, not plural zones, can be established as the first open zone OPENED_ACT. The memory system 110 may establish a state of the zone associated with the program command as the first open zone OPENED_ACT when recognizing information regarding a zone identifier or information regarding plural zones which is inputted along with the program command.

The memory system 110 may allocate a region of the write buffer for the first open zone OPENED_ACT. A size of the region allocated for the first open zone (OPENED_ACT) may be greater than a size of data programmed once in the memory device. For example, the size of the region allocated for the first open zone OPENED_ACT may be twice the minimum size of data programmed once in the memory device 150. After establishing a state of a specific zone associated with the program command as the first open zone OPENED_ACT, the memory system 110 may check whether data associated with the specific zone is stored in the SLC buffer. When data for the specific zone is stored in the SLC buffer, the memory system 110 reads data stored in the SLC buffer and configures a unit of data to be programmed in a memory block by gathering read data and data stored in the write buffer, and then programs the unit of data in the memory block of the memory device 150. The memory block corresponding to the specific zone may include multi-level memory cells.

The memory system 110 may use a pipelining scheme to avoid performance degradation caused by standing by (or delaying) a program operation regarding data buffered in the write buffer for a time of reading data stored from the SLC buffer. It can be assumed that first and second pieces of data are sequentially buffered in the write buffer. When the first piece of data stands by for configuring the unit of data while the data stored in the SLC buffer is read, the second piece of data in the write buffer may be programmed before the first piece of data is programmed. After the second piece of data is programmed in the memory device 150, the unit of data including the first piece of data and the data stored in the SLC buffer can be programmed in the memory device 150. Accordingly, because the write buffer may additionally need a space to store data to be programmed while reading data from the SLC buffer, a size of the region in the write buffer, which is allocated for the first open zone OPEN_ACT, may be greater than the size of data programmed once in the memory device 150.

The second open zone OPENED_ALLOC may indicate a specific zone for which a region of the write buffer is allocated. The region of the write buffer allocated for the second open zone OPENED_ALLOC may have a size of data programmed once in the memory device 150. Plural zones can be established as the second open zone OPENED_ALLOC. When another program request associated with a specific zone established as the first open zone OPENED_ACT is inputted, the memory system 110 may change a state of the specific zone from the first open zone OPENED_ACT to the second open zone OPENED_ALLOC. Further, when another program command inputted is associated with the specific zone established as the second open zone OPENED_ALLOC, the state of the specific zone is changed from the second open zone OPENED_ALLOC to the first open zone OPENED_ACT and, then, changed from the first open zone OPENED_ACT back to the second open zone OPENED_ALLOC. The memory system 110 may allocate a region of the write buffer for a specific zone established as the second open zone OPEND_ALLOC. The size of the region allocated for the second open zone OPENED_ALLOC may be the same as a unit of data programmed once in a memory block of the memory device.

The third open zone OPENED_UNALLOC refers to a specific zone for which any region of the write buffer is not allocated. Data associated with a specific zone established as the third open zone OPENED_UNALLOC may be stored in the SLC buffer. When all regions of the write buffer have been allocated, a program request associated with a specific zone other than the zones established as the second open zone OPENED_ALLOC may be inputted. The memory system 110 may determine which one of the zones established as the second open zone OPENED_ALLOC satisfies a preset condition. Herein, the present condition may be various with different priorities. The state of the zone satisfying the preset condition can be changed to the third open zone OPEND_UNALLOC. The memory system 110 may move data, associated with the zone established as the third open zone OPENED_UNALLOC and stored in the write buffer, in the SLC buffer. Subsequently, receiving another program request associated with a zone established as the third open zone OPENED_UNALLOC, the memory system 110 may change a state of the zone from the third open zone OPENED_UNALLOC to the first open zone OPENED_ACT and loads data stored in the SLC buffer into a region of the write buffer allocated for the first open zone OPENED_ACT. The memory system 110 may perform a program operation after configuring a unit of data from loaded data and program data inputted along with the another program request.

The memory system 110 may preferentially change a state of a zone established as the implicitly opened zone OPENED_IMP to the second open zone OPENED_ALLC or the third open zone OPENED_UNALLC. The implicitly opened zone OPENED_IMP of FIG. 3 is not a zone requested by a host through an explicit command, but a zone designated by the memory system 110 in response to a program command received from the host 102. Thus, the write buffer can be allocated preferentially for the explicitly opened zone OPENED_EXP rather than the implicitly opened zone OPENED_IMP.

When there are plural zones established as the implicitly opened zone OPENED_IMP, the memory system 110 may preferentially establish a zone having a small amount of data stored in the write buffer as the third open zone OPENED_UNALLOC. When a state of the zone is changed to the third open zone OPEND_UNALLOC, the memory system 110 may move data associated with the third open zone OPEND_UNALLOC from the write buffer in the SLC buffer. In addition, data stored in the SLC buffer may be read and loaded in the write buffer when a program request associated with a zone established as the third open zone OPEND_UNALLOC is inputted. Data migration between the SLC buffer and the write buffer can cause performance degradation, so that the memory system can select a specific zone having the smallest amount of data programmed/read to/from the SLC buffer to avoid performance degradation.

When there are plural candidate zones which are established as the implicitly opened zone OPENED_IMP and have the smallest amount of data in the write buffer, the memory system 110 can preferentially select which one of the plural candidate zones has oldest data which has been stored for the longest time and establish a selected zone as the third open zone OPENED_UNALLOC. The memory system 110 may allocate a region of the write buffer for a zone having data more frequently programmed to improve program performance.

FIGS. 7A to 7D are diagrams illustrating a method of changing a state of a zone to one of the first to the third open zones according to an embodiment of the disclosure.

Figure 7A:
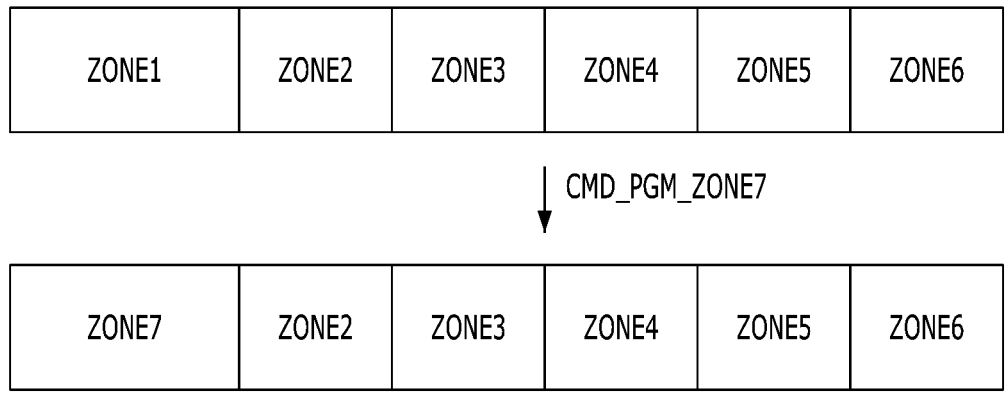
FIG. 7A to 7D are diagrams illustrating a method of changing a state of a zone to first to third open zones according to an embodiment of the disclosure.

Referring to FIGS. 7A to 7D, the write buffer may be divided into six regions, each region allocated for a respective one of six zones. As shown in FIG. 4, it is assumed that the number of closed state zones reaches a threshold. FIG. 7A shows a case where six regions of the write buffer are allocated to the first to sixth zones ZONE1-ZONE6. The first zone ZONE1 is the first open zone OPEN_ACT, and each of the second to the sixth zones ZONE2 to ZONE6 are the second open zone OPEN_ALLOC. In each region of the write buffer, program data associated with the corresponding zone is temporarily stored. No more closed state zones may be created because the number of closed state zones has already reached the maximum allowable threshold. Thus, the seventh zone ZONE7 may not be established as the closed state zone.

The size of each region of the write buffer allocated for the second to the sixth open zones ZONE2 to ZONE6 is the same as a unit of data programmed once in the memory block. But the size of the region of the write buffer allocated for the first open zone ZONE1 may be greater than the unit of data. When the memory system 110 receives a program command CMD_PGM_ZONE7 associated with the seventh zone from the host, the memory system 110 should establish a state of any one of the first to the sixth zones ZONE1 to ZONE6 to the third open zone OPEN_UNALLOC. As described above, the memory system 110 may determine which one of the first to sixth zones (ZONE1-ZONE6) is established as the third open zone OPEN_UNALLOC according to the preset condition. For example, if the first zone ZONE1 is the implicitly opened zone OPENED_IMP and the second to the sixth zones ZONE2 to ZONE6 are the explicitly opened zone OPENED_EXP, the memory system 110 can establish a state of the first zone ZONE1 as the third open zone OPENED_UNALLOC. Thereafter, the memory system 110 may move data stored in the region allocated for the first zone ZONE1 in the write buffer to the SLC buffer.

Figure 7B:
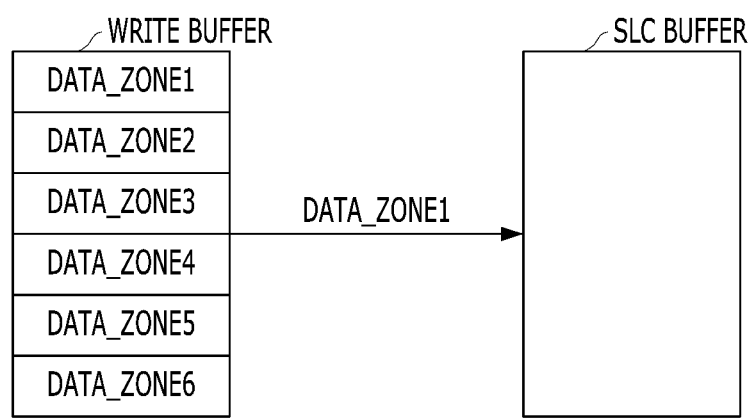

FIG. 7B is a diagram illustrating a method for moving data stored in a region of the write buffer, which is allocated for the first zone ZONE1, to the SLC buffer.

The write buffer may be included in, or engaged with, the controller, and may be implemented as a volatile memory such as DRAM. Data DATA_ZONE1 to DATA_ZONE6 associated with the first to the sixth zones may be individually stored in each region of the write buffer. The SLC buffer is a kind of non-volatile memory block in the memory device. The SLC buffer may include single-level memory cells, each cell capable of storing one-bit data.

The memory system 110 programs the data DATA_ZONE1 associated with the first zone in the write buffer to the SLC buffer, after establishing a state of the first zone ZONE1 as the third open zone OPEND_UNALLOC. When the data DATA_ZONE1 associated with the first zone is stored in the SLC buffer, the memory system 110 may record a physical address of the SLC buffer at which the data DATA_ZONE1 associated with the first zone is stored as information regarding plural zones of a namespace. When another program command associated with the first zone ZONE1 is received later, the memory system 110 may read the data DATA_ZONE1 associated with the first zone from the SLC buffer based on the information regarding the plural zones.

After moving the data DATA_ZONE1 associated with the first zone to the SLC buffer, the memory system 110 may establish a state of the seventh zone ZONE7 as the first open zone OPENED_ACT. The memory system 110 may allocate the region of the write buffer, previously allocated to the first zone ZONE1, for the seventh zone ZONE7. The size of the region allocated for the seventh zone ZONE7 may be greater than the unit of data programmed once. The memory system 110 may temporary store data associated with the seventh zone ZONE7 in a write buffer, configure the unit of data based on temporarily stored data, and then program configured unit of data to a memory block of the memory device 150.

Figure 7C:
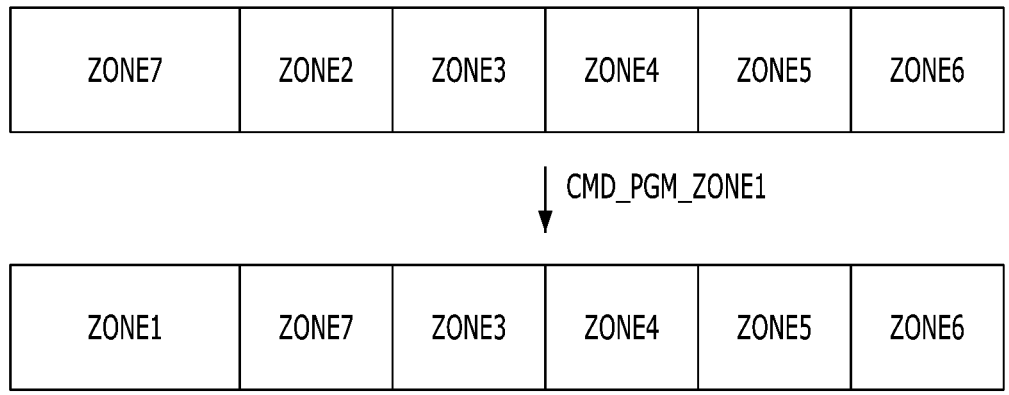

FIG. 7C shows a case in which regions of the write buffer are allocated to the second to the seventh zones ZONE2-ZONE7. A state of the seventh zone ZONE7 is the first open zone OPEN_ACT, and states of the second to the sixth zones ZONE2-ZONE6 are the second open zone OPEN_ALLOC. Further, the state of the first zone ZONE1 for which any region of the write buffer is not allocated is the third open zone OPENED_UNALLOC.

When the memory system 110 receives a program command CMD_PGM_ZONE1 associated with the first zone ZONE1 from the host 102, the memory system 110 should try to establish a state of any one of the second to the seventh zones ZONE2 to ZONE7 to the third open zone OPENED_UNALLOC. For example, when the second to the seventh zones ZONE2 to ZONE7 are the explicitly opened zone OPENED_EXP, the memory system 110 may compare an amount of data in each region of the write buffer, allocated for the second to the seventh zones ZONE2 to ZONE7, with that of each other. When the amount of data associated with the second zone ZONE2 is the lowest among all data which is associated with the second to the seventh zones ZONE2-ZONE7 and stored in the write buffer, the memory system 110 may establish a state of the second zone ZONE2 as the third open zone OPENED_UNALLOC. As described above with reference to FIG. 7B, the memory system 110 may move data, which is associated with the second zone ZONE2 and stored in the write buffer, into the SLC buffer. The memory system 110 may record a physical address of the SLC buffer in the information about the plural zones.

The memory system 110 may establish a state of the seventh zone ZONE7 as the second open zone OPENED_ALLOC, after establishing a state of the second zone ZONE2 as the third open zone OPENED_UNALLOC. After establishing the state of the seventh zone ZONE7 as the second open zone OPENED_ALLOC, the state of the first zone ZONE1 may be established as the first open zone OPENED_ACT. Then, the memory system 110 may allocate a region in the write buffer for the first zone ZONE1, and a size of the allocated region may be greater than a unit of data programmed once in the memory device 150. The memory system 110 may store data provided from the host 102 in the write buffer, and check whether data associated with the first zone ZONE1 is stored in the SLC buffer based on the information about the plural zones. When the data associated with the first zone ZONE1 is stored in the SLC buffer, the memory system 110 reads and loads the data associated with the first zone ZONE1 from the SLC buffer to the allocated region of the write buffer. The memory system 110 may configure the data provided from the host 102 and the loaded data into a unit of data for a program operation, and then, program the unit of data in a memory block of the memory device 150.

Figure 7D:
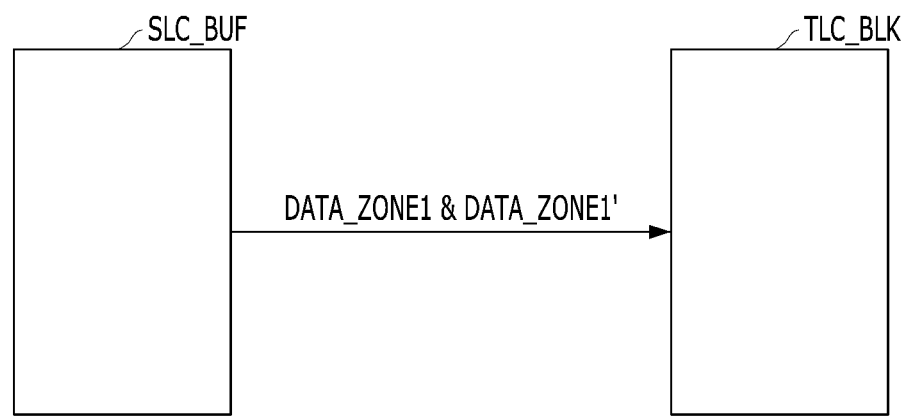

FIG. 7D is a diagram illustrating a method for programming data stored in a write buffer, after reading data associated with a first open zone from an SLC buffer.

In FIG. 7D, the SLC buffer may be the same as the SLC buffer shown in FIG. 7B. Second data DATA_ZONE1', which is associated with the first zone ZONE1 and provided from the host 102, may be stored in the write buffer. The first data DATA_ZONE1 may be stored in the SLC buffer, which had been stored in the write buffer before the state of the first zone ZONE1 was established as the third open zone OPENED_UNALLOC. For convenience, it is assumed that the sum of the amounts of the first data DATA_ZONE1 and the second data DATA_ZONE1' are the same as a unit of data programmed once in the memory device 150.

The memory system 110 may read data DATA_ZONE1, associated with the first zone ZONE1, from the SLC buffer SLC_BUF based on the information regarding the plural zones. While loading the data DATA_ZONE1 from the SLC buffer SLC_BUF, other data DATA_ZONE1' which is associated with the first zone ZONE1 and stored in the write buffer may not be programmed in a TLC memory block TLC_BLK. The memory block TLC_BLK may include a plurality of memory cells, each cell capable of storing 3-bit data. In a case of the data processing system 100 including the memory system 110 with the zoned namespace, a sequential program operation may be performed on a memory block corresponding to each zone. The sequential program operation may include at least one process for programming plural pieces of data, each piece corresponding to a respective one of consecutive logical block addresses, in a memory block. For example, the consecutive logical block addresses may be in an ascending order.

Further, a sequence of the logical block addresses may be different from an order where plural requests or commands are received. A value of logical block address associated with a command provided first from the host 102 may be less than that of the command provided later. The logical block address associated with the data DATA_ZONE1 stored in the SLC block may precede the logical block address associated with the data DATA_ZONE1' stored in the write buffer. Further, there is no continuity between the logical block addresses associated with the data DATA_ZONE1, DATA_ZONE1' stored in the SLC block and the write buffer. Therefore, while reading and loading the data DATA_ZONE1 from the SLC buffer, the memory system 110 may postpone programming the data DATA_ZONE1', which is associated with the first zone ZONE1 and stored in the write buffer, to the memory block TLC_BLK.

In an embodiment, after reading and loading the data DATA_ZONE1 associated with the first zone ZONE1 from the SLC buffer, the memory system 110 may program both the loaded data DATA_ZONE1 and the program data DATA_ZONE1' stored in the write buffer into the memory block TLC_BLK. While reading the data DATA_ZONE1 from the SLC block, the program data DATA_ZONE1' stored in the write buffer is not programmed so that performance may be degraded. To avoid performance degradation, the memory system 110 may program another subsequent data DATA_ZONE1" associated with the first zone ZONE1 stored in the write buffer to the memory block TLC_BLK according to a pipelining scheme, while reading and loading the data DATA_ZONE1 from the SLC block.

Figure 8:
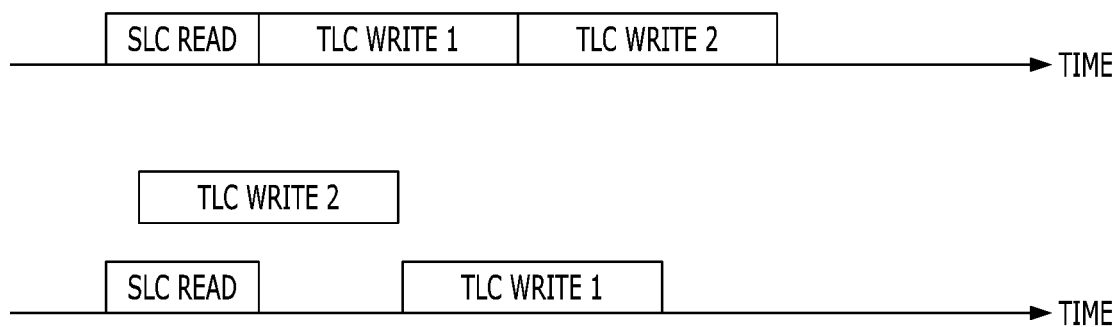
FIG. 8 is a diagram illustrating a program operation according to a pipe lining scheme.

FIG. 8 is a diagram illustrating a program operation through a pipelining scheme.

Referring to FIG. 8, when the memory system 110 does not use the pipelining scheme, an operation (SLC READ) of reading data DATA_ZONE1 associated with the first zone ZONE1 from the SLC buffer is completed, and then both the read data DATA_ZONE1 obtained from the SLC buffer and program data DATA_ZONE1' stored in the write buffer may be programmed to a TLC memory block (TLC WRITE 1). After both the read data DATA_ZONE1 and the program data DATA_ZONE1' are programmed (TLC WRITE 1), a program operation for subsequent data DATA_ZONE1" associated with the first zone ZONE1 stored in the write buffer may be performed (TLC WRITE 2). However, when the memory system 110 uses the pipelining scheme, the program operation for the subsequent data DATA_ZONE1", which is associated with the first zone ZONE1 and stored in the write buffer, may be performed (TLC WRITE 2) before the program operation for both the read data DATA_ZONE1 and the program data DATA_ZONE1'. While the memory system 110 reads and loads the read data DATA_ZONE1 from the SLC buffer (SLC READ), the memory system 110 may start programming the subsequent data DATA_ZONE1" in the TLC memory block (TLC WRITE 2). After the subsequent data DATA_ZONE1" is programmed, both the read data DATA_ZONE1 and the program data DATA_ZONE1' may be programmed (TLC WRITE 1). As these two cases are compared with each other, performance of the memory system 110 may be improved using the pipelining scheme.

When the program data DATA_ZONE1' and the subsequent data DATA_ZONE1", which are associated with the first zone ZONE1, are stored in the write buffer, the program data DATA_ZONE1' and the subsequent data DATA_ZONE1" would be programmed sequentially in the TLC memory block so that the continuity between the logical block addresses associated with the program data DATA_ZONE1' and the subsequent data DATA_ZONE1" can be maintained even at the physical addresses in the TLC memory block. However, in order to avoid performance degradation caused from a temporary stop of the program operation for the program data DATA_ZONE1' stored in the write buffer, the subsequent data DATA_ZONE1" associated with the first zone ZONE1 may be programmed earlier than the program data DATA_ZONE1'. When the program data DATA_ZONE1' is programmed following the subsequent data DATA_ZONE1", the continuity between the logical block addresses associated with the program data DATA_ZONE1' and the subsequent data DATA_ZONE1" may be not maintained at the physical addresses of the TLC memory block. To maintain the continuity between the logical block addresses, the subsequent data DATA_ZONE1" may be programmed at a location followed by an empty area reserved for the program data DATA_ZONE1' which is later programmed in the same memory block TLC_BLK. Herein, a size of the empty area may be fixed because the memory system 110 may perform a program operation for each unit of data programmed once in the memory device 150 including the TLC memory block TLC_BLK.

For example, the memory system 110 programs the program data DATA_ZONE1' and the subsequent data DATA_ZONE1" associated with the first zone ZONE1 on sequential pages, e.g., a first page and a second page, of the memory block TLC_BLK. Conventional sequential program operations may maintain the continuity of logical block addresses as well as physical addresses of the memory block TLC_BLK. But, in an embodiment, locations for the program data DATA_ZONE1' and the subsequent data DATA_ZONE1" may be pre-determined. Regardless of a sequence of program operations regarding the program data DATA_ZONE1' and the subsequent data DATA_ZONE1", the program data DATA_ZONE1' and the subsequent data DATA_ZONE1" may be individually programmed on designated pages of the memory block TLC_BLK. Accordingly, after subsequent data DATA_ZONE1" is programmed on the second page of the memory block TLC_BLK, both the program data DATA_ZONE1' and read data obtained from the SLC buffer may be programmed on the first page of the memory block TLC_BLK.

Referring back to FIG. 5, the zone information manager 502 may update information regarding the plural zones and store the updated information in the memory 144. The information regarding the plural zones may include a parameter regarding a zone identifier, a zone state, and an address of memory block allocated for the corresponding zone. The zone information manager 502 may check the information regarding the plural zones in the memory 144, when information related to the zone identifier ID_ZONE is inputted along with a program command PGM_CMD from the host 102. The zone information manager 502 may provide the information related to the zone identifier ID_ZONE and the information regarding the plural zones to the zone state manager 510.

The zone state manager 510 may establish a state of the zone corresponding to the program command PGM_CMD as the first open zone OPENED_ACT based on the information related to the zone identifier ID_ZONE and the information regarding the plural zones. In addition, the zone state manager 510 may control the write buffer manager 504 to allocate a region of the write buffer for the zone established as the first open zone OPENED_ACT. The zone state manager 510 may control the SLC buffer manager 506 to check whether any piece of data associated with the zone corresponding to the program command PGM_CMD is stored in the SLC buffer.

Further, when a zone corresponding to the first open zone OPENED_ACT is changed in response to a new program command received by the memory system 110, the zone state manager 510 may change a state of the zone which have been established as the first open zone OPENED_ACT into the second open zone OPENED_ALLOC. The zone state manager 510 may change a state of one of the zones for which a region of the write buffer is allocated into the third open zone OPEND_UNALLOC when the new program command is associated with a zone for which the region of the write buffer has not been allocated. Subsequently, when the program command is associated for a zone established as the third open zone OPENED_UNALLOC, the zone state manager 510 changes a state of the zone established as the third open zone OPENED_UNALLOC into the first open zone OPENED_ACT, and controls the SLC buffer manager 506 to read data which is associated with the zone and stored in the SLC buffer.

The write buffer manager 504 may allocate a region of the write buffer for a specific zone established as the first open zone OPENED_ACT under the control of the zone state manager 510. The size of the region in the write buffer allocated for the specific zone established as the first open zone OPENED_ACT may be greater than a size of unit of data programmed once in the memory device 150. The write buffer manager 504 may allocate a region of the write buffer for a zone established as the second open zone OPENED_ALLOC. A size of the allocated region for the zone established as the second open zone OPENED_ALLOC may be the same as the size of unit of data programmed once. The write buffer manager 504 may retrieve or release the region of the write buffer allocated for the zone whose state is established as the third open zone OPENED_UNALLOC.

The SLC buffer manager 506 may check whether a piece of data associated with a zone corresponding to the program command is stored in the SLC buffer under the control of the zone state manager 510. When the piece of data associated with the zone is stored in the SLC buffer, the SLC buffer manager 506 may control the memory device 150 to obtain the piece of data from the SLC buffer. Also, the SLC buffer manager 506 may control the memory device 150 to store a piece of data, which is associated with the third open zone OPENED_UNALLOC and stored in the write buffer, in the SLC buffer. Subsequently, when the memory system 110 receives a program command associated with a zone established as the third open zone OPENED_UNALLOC, the SLC buffer manager 506 changes a state of the zone established as the third open zone OPENED_UNALLOC to the first open zone OPENED_ACT, and control the memory device 150 to read and load data stored in the SLC buffer.

The NAND manager 508 may control the memory device 150 to program data, which is associated with a zone and stored in the write buffer, in a memory block corresponding to (or allocated for) the zone. When data associated with the zone corresponding to the program command is stored in the SLC buffer, the NAND manager 508 configures a unit of program data including data obtained from the SLC buffer and data which is inputted from the host 102 and stored in the write buffer. The memory device 150 may be controlled to program configured data into a memory block. The memory block may include multi-level memory cells.

The NAND manager 508 may use a pipelining scheme to avoid performance degradation caused by waiting for an operation of programming the buffered data in the write buffer when data is read from the SLC buffer. Specifically, when first and second pieces of data are sequentially buffered in the write buffer, the first piece of data and other data stored in the SLC buffer may be reorganized as the unit of program data, and the second piece of data is programmed in the memory block while the first piece of data is reorganized. The NAND manager 508 may control the memory device 150 to program the second piece of data while reading data stored in the SLC buffer. After the second piece of data is programmed, reorganized data including the first piece of data may be programmed.

Figure 9A:
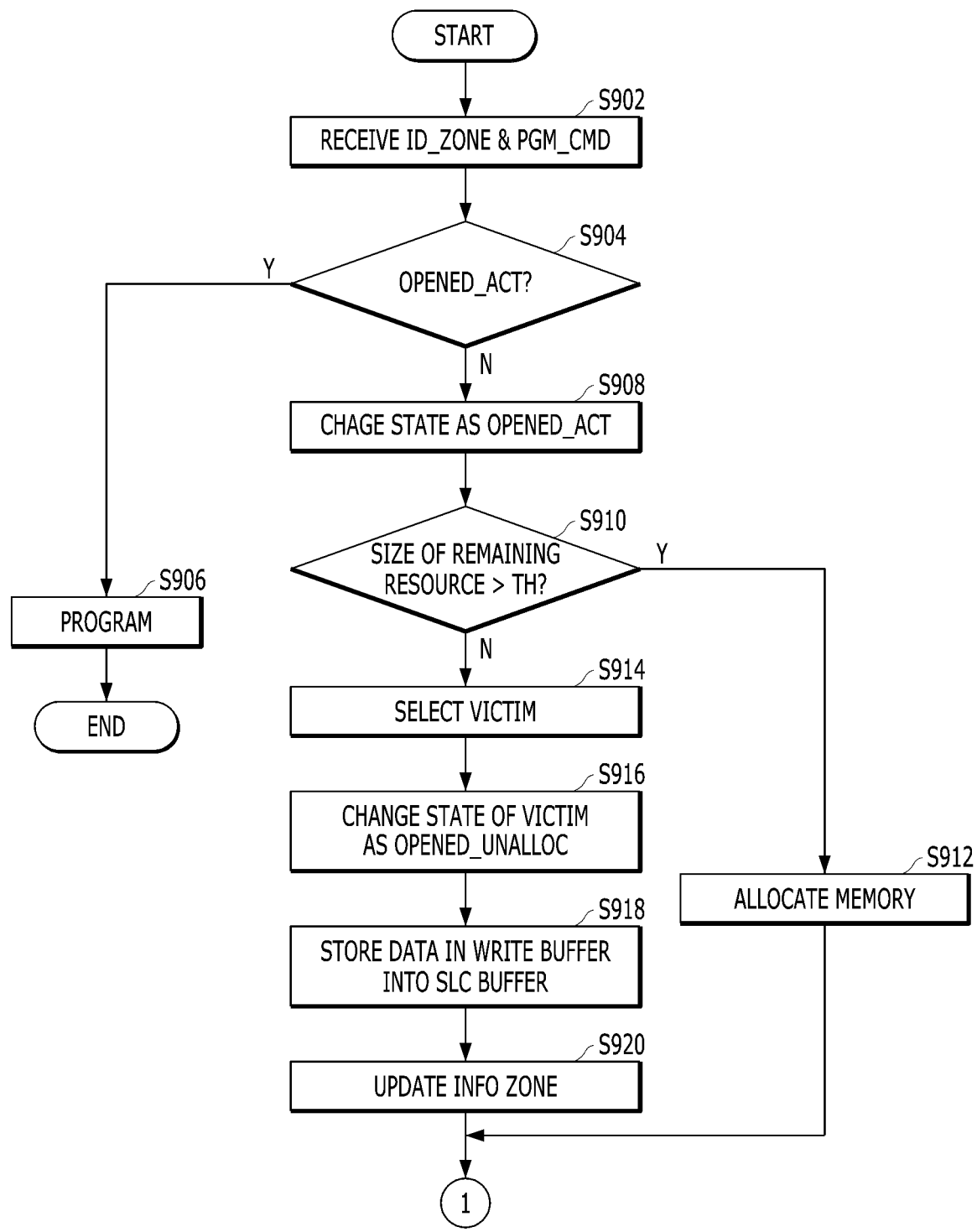
FIGS. 9A and 9B are flowcharts illustrating a method of operating a memory system according to an embodiment of the disclosure.
Figure 9B:
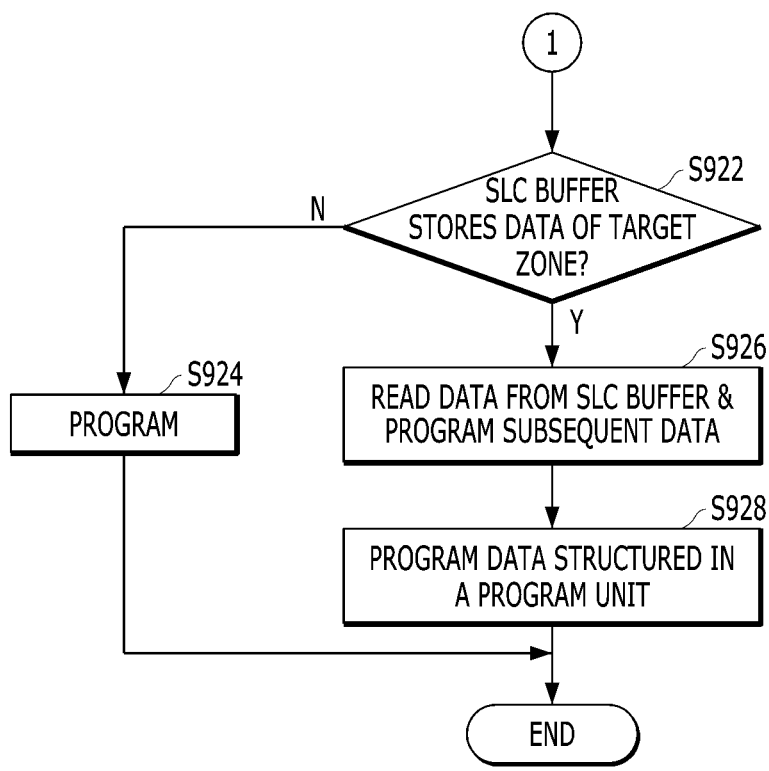

FIGS. 9A and 9B are flowcharts illustrating a method for operating a memory system according to an embodiment of the disclosure.

Referring to FIG. 9A, in step S902, the controller 130 may receive information related to the zone identifier ID_ZONE and a program command PGM_CMD from the host 102. The information related to the zone identifier ID_ZONE may include an identifier for the zone corresponding to the program command PGM_CMD. For example, when an application program executed by the host 102 generates a program command PGM_CMD associated for a first zone ZONE1, an identifier of the first zone ZONE1 may be received with the program command PGM_CMD and the controller 130 may receive the identifier of the first zone ZONE1.

In step S904, the controller 130 may determine whether a state of a zone corresponding to the program command PGM_CMD is established as the first open zone OPENED_ACT. The controller 130 may check the state of the zone associated with the program command PGM_CMD based on information regarding the plural zones stored in the memory 144. The information regarding the plural zones may indicate a parameter showing a state of each zone.

In step S906, when a state of the zone associated with the program command PGM_CMD is established as the first open zone OPENED_ACT ('Y' in the step S904), the controller 130 may control the memory device 150 to program data corresponding to the program command PGM_CMD in a memory block.

In step S908, when a state of the zone associated with the program command PGM_CMD is not established as the first open zone OPENED_ACT ('N' in the step S904), the controller 130 may establish the state of the zone as the first open zone OPENED_ACT.

In step S910, the controller 130 may compare remaining storage capacity of the write buffer (i.e., a size of remaining resource of the write buffer) with a threshold TH. The threshold TH may be the minimum storage capacity allocated for the first open zone OPENED_ACT. For example, the threshold TH may be twice a size of unit of data programmed once to the memory device 150.

In step S912, when the remaining storage capacity of the write buffer is greater than the threshold TH ('Y' in the step S910), the controller 130 may allocate a region of the write buffer for a zone established as the first open zone OPENED_ACT. For example, a size of the allocated region may be twice the size of the unit of data programmed once.

In step S914, when the remaining storage capacity of the write buffer is less than or equal to the threshold TH ('N' in the step S910), the controller 130 may select a victim zone VICTIM among the zones for which the regions of the write buffer are allocated. The criteria for selecting the victim zone VICTIM may be, as described above, whether a zone is the implicitly opened zone OPENED_IMP, which zone has the least size of data stored in the write buffer, and how old a program operation associated with the zone is performed.

In step S916, the controller 130 may change a state of the victim zone VICTIM into the third open zone OPENED_UNALLOC.

In step S918, the controller 130 may control the memory device 150 to program data, associated with the victim zone VICTIM and stored in the write buffer, into the SLC buffer. The controller 130 may then release the region of the write buffer allocated for the victim zone VICTIM.

In step S920, the controller 130 may update the information regarding the plural zones by recording a physical address, indicating a location where the data associated with the victim zone VICTIM is stored, in the information regarding the plural zones. The controller 130 may store the information regarding the plural zones in the memory 144.

Referring to FIG. 9B, in step S922, the controller 130 may check whether data associated with a target zone is stored in the SLC buffer. The target zone may indicate a zone whose state is established as the first open zone OPENED_ACT in step S908, that is, the program command PGM_CMD corresponding to that zone is received in step S902. The controller 130 may check whether data of the target zone is stored in the SLC buffer based on the information regarding the plural zones.

In step S924, when the data of the target zone is not stored in the SLC buffer ('N' in step S922), the controller 130 may control the memory device 150 to program data inputted along with the program command PGM_CMD into a memory block.

In step S926, when the data associated with the target zone is stored in the SLC buffer ('Y' in step S922), the controller 130 may control the memory device 150 to read the data from the SLC buffer. The controller 130 may control the memory device 150 to perform a program operation on subsequent program data SUBSEQUENT DATA while reading the data from the SLC buffer via the pipelining scheme described with reference to FIG. 8.

In a step S928, the controller 130 may configure a program data unit, including the data read from the SLC buffer and data stored in the write buffer, and control the memory device 150 to program the program data unit in the memory block.

In an embodiment of the disclosure, the memory system 110 may increase the number of open zones to simultaneously handle plural requests occurring from a plurality of application programs or a plurality of processors.

While the disclosure illustrates and describes specific embodiments, it will be apparent to those skilled in the art in light of the present disclosure that various changes and modifications may be made without departing from the spirit and scope of the invention as defined in the following claims. The present invention encompasses all such changes and modifications that fall within the scope of the claims.

What is claimed is:

1. A memory system with at least one namespace, comprising:
a memory device including a plurality of single-level cell (SLC) buffers and a plurality of memory blocks, wherein each memory block includes a plurality of memory cells, each memory cell storing multi-bit data, and is allocated for a respective one of a plurality of zones, wherein each of the at least one namespace is divided into at least some of the plurality of zones; and
a controller configured to receive a program request related to at least one application program executed by a host, to determine at least one zone designated by the at least one application program as an open state, and to control the memory device to perform a program operation on at least one memory block allocated for an open state zone,
wherein the controller is configured to control the memory device to establish first, second and third open zones, and to assign a first region of a write buffer to the first open zone and a second region of the write buffer to the second open zone,
wherein, when a target zone subject to a new program request is neither the first open zone nor the second open zone, the controller is configured to determine which one of the first region and the second region is a victim, establish the open state zone associated with the victim as the third open zone, program data associated with the third open zone to a first SLC buffer among the plurality of SLC buffers, and store first data provided with the new program request to one of the first region and the second region, which is determined as the victim, in the write buffer.

2. The memory system according to claim 1, wherein the controller is configured to control the memory device to read second data from a second SLC buffer, among the plurality of SLC buffers, based on information regarding the plurality of zones, when the second data corresponding to the target zone is stored in the second SLC buffer.

3. The memory system according to claim 2, wherein the first data includes a first piece of data and a second piece of data, and the first and second pieces of data are stored sequentially in the write buffer.

4. The memory system according to claim 3, wherein the controller is configured to control the memory device to program the second piece of data to a target memory block corresponding to the target zone, while reading the second data.

5. The memory system according to claim 4, wherein the controller is configured to control the memory device to program the second data and the first piece of data to the target memory block.

6. The memory system according to claim 1, wherein a first size of the second region associated with the second open zone is equal to a second size of a group of memory cells programmed together, and
a third size of a region assigned for the target zone established as the first open zone is greater than the second size.

7. The memory system according to claim 1, wherein the controller is configured to determine the victim based on a priority, and
wherein the priority includes:
a first highest priority assigned to an implicitly open state zone;
a second highest priority assigned to an open state zone associated with the smallest size of data stored in the first and second regions of the write buffer; and
a third highest priority assigned to an open state zone associated with the oldest programmed data stored in the first and second regions of the write buffer.

8. The memory system according to claim 1, wherein the controller is configured to release the second region determined as the victim, allocate the first region for a new second region, and split the first region into plural parts, each part having the same size as the group of memory cells programmed together.

9. The memory system according to claim 1, wherein the controller is configured to update information regarding the plurality of zones after storing data associated with the victim in the first SLC buffer.

10. The memory system according to claim 1, wherein data inputted from the host is stored in the write buffer, and
   a size of the data inputted from the host is less than a size of a group of memory cells programmed together.

11. A method for operating memory system with at least one namespace, the method comprising:
   receiving a program request related to at least one application program executed by a host;
   storing data inputted along with the program request in a write buffer or a plurality of single-level cell (SLC) buffers;
   determining at least one zone designated by the at least one application program, among a plurality of zones, as an open state; and
   performing a program operation on at least one memory block allocated for an open state zone,
   wherein the open state zone is established as first, second and third open zones, a first region of the write buffer is assigned to the first open zone, and a second region of the write buffer is assigned to the second open zone,
   wherein the method further comprises, when a target zone subject to a new program request is neither the first open zone nor the second open zone, determining which one of the first region and the second region is a victim, establishing the open state zone associated with the victim as the third open zone, programing data associated with the third open zone to a first SLC buffer among the plurality of SLC buffers, and storing first data provided with the new program request to one of the first region and the second region, which is determined as the victim, in the write buffer.

* * * * *